United States Patent [19]

Carr

[11] 4,251,908
[45] Feb. 24, 1981

[54] SIDE-WELDED FAST RESPONSE SHEATHED THERMOCOUPLE

[75] Inventor: Kenneth R. Carr, Knoxville, Tenn.

[73] Assignee: The United States of America as represented by the United States Department of Energy, Washington, D.C.

[21] Appl. No.: 3,558

[22] Filed: Jan. 15, 1979

[51] Int. Cl.$^3$ ............................................. B01J 17/00
[52] U.S. Cl. ..................................... 29/573; 29/591; 136/233
[58] Field of Search ................... 29/573, 591; 136/233

[56]  References Cited
U.S. PATENT DOCUMENTS

| | | | |
|---|---|---|---|
| 3,314,129 | 4/1967 | Pugh | 29/573 |
| 3,607,447 | 9/1971 | Davis | 29/573 |
| 3,939,554 | 2/1976 | Finney | 29/573 |

Primary Examiner—W. C. Tupman
Attorney, Agent, or Firm—Louis M. Deckelmann; Stephen D. Hamel; James E. Denny

[57]  ABSTRACT

A method of fabricating the measuring junction of a grounded-junction sheathed thermocouple to obtain fast time response and good thermal cycling performance is provided. Slots are tooled or machined into the sheath wall at the measuring junction, the thermocouple wires are laser-welded into the slots. A thin metal closure cap is then laser-welded over the end of the sheath. Compared to a conventional grounded-junction thermocouple, the response time is 4–5 times faster and the thermal shock and cycling capabilities are substantially improved.

1 Claim, 1 Drawing Figure

U.S. Patent
Feb. 24, 1981
4,251,908
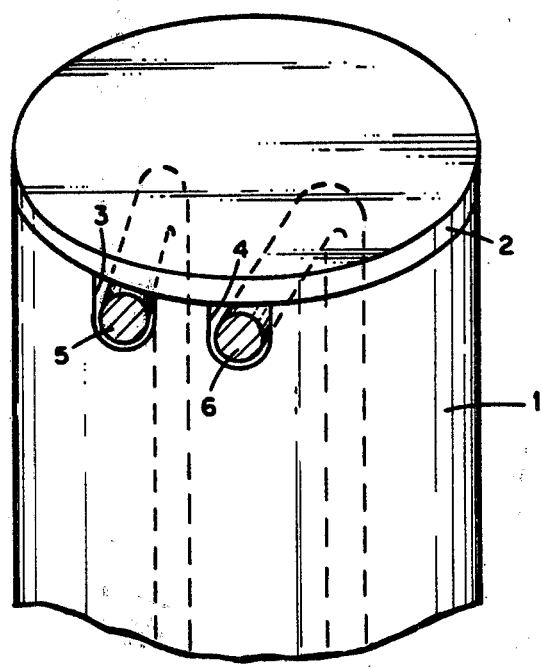

SIDE-WELDED FAST RESPONSE SHEATHED THERMOCOUPLE

BACKGROUND OF THE INVENTION

This invention was made in the course of, or under, a contract with the U.S. Department of Energy.

Temperature sensors with fast response times (time constants <100 msec) are needed in reactor safety and control systems, and also in process instrumentation where transient analyses are performed. In addition to the requirement for fast response times, thermocouples for reactor applications must also survive repeated, severe thermal cycling without disruption of the thermocouple circuit through differential thermal expansion.

Conventional sheathed thermocouples, with either insulated or grounded measuring junctions, respond less rapidly than desired due to their size and to the construction of their measuring junctions. In an insulated-junction thermocouple, the heat must pass from the sheath surface through insulation to the measuring junction. The rate of heat transfer is often a function of temperature. In the grounded-junction thermocouples, the measuring junction is connected directly to the tip of the sheath and the heat does not have to pass through insulation. However, conventional methods for fabricating grounded-junction thermocouples often create an effective measuring junction that may be several wire diameters removed from the tip due to alloying and diffusion during the end-closure welding. The response time is increased because of the displacement of the effective junction and because of the large mass of metal of welded material in the tip region.

In reactor application, particularly, permanently-installed thermocouples may undergo hundreds or thousands of moderate thermal cycles per year, and designers want as much margin as possible for thermocouple integrity under such conditions.

Thus, there exists a need to provide an improved method of fabricating the measuring junction of a grounded-junction sheathed thermocouple wherein an increased fast time response and good thermal cycling performance are achieved with a subsequent use of such a thermocouple. The present invention was conceived to meet this need in a manner to be described hereinbelow.

SUMMARY OF THE INVENTION

It is the object of the present invention to provide an improved method of fabricating the measuring junction of a grounded-junction sheathed thermocouple that will have improved fast time response and better thermal cycling performance than heretofore possible.

The above object has been achieved by first removing the insulation from the region of the measuring junction, bending the thermocouple wires 90° at the measuring junction, placing the ends of the bent wires into slots tooled or machined in the sheath, placing a thin metal disc over the end of the sheath, and then laser-welding the ends of the wires and the disc to the sheath.

BRIEF DESCRIPTION OF THE DRAWING

The single FIGURE is a partial isometric view of a completed thermocouple fabricated in accordance with the above method.

DESCRIPTION OF THE PREFERRED EMBODIMENTS

The single FIGURE illustrates a partial showing of a grounded-junction thermocouple fabricated in accordance with the present invention. The device of the FIGURE is not drawn to scale and was enlarged for the sake of clarity. For example, the outer diameter of the thermocouple is 1/16 inch, the end cap 2 is 0.003 inch thick, and the spacing between the thermocouple wires 5 and 6 in the respective slots 3 and 4 is 0.010 inch.

The method of fabricating the thermocouple shown in the single FIGURE will now be described. The insulation is first removed from the region of the measuring junction, e.g., about 0.025 in. Closely-spaced small slots 3 and 4 are then tooled or machined in the sheath 1 of the thermocouple. The thermocouple wires 5 and 6 are then bent 90° and the tips thereof are inserted into the respective slots 3 and 4. A thin metal disc 2 is placed over the end of the sheath 1 and the tips of the wires and the disc are then laser-welded to the sheath. If desired, insulation may be added prior to welding.

As a result, the effective thermoelectric measuring junction is at the end of the sheath since the short-pulse laser welding reduces the diffusion and alloying along the thermocouple wires. The action of bending the thermocouple wires 90° from their axial position to a radial orientation results in a stress-relieving configuration that improves the thermocouple's resistance to thermal cycling failures. The thin end cap reduces the thermal mass of the measuring junction and improves the time response.

It has been determined that the response time of a grounded-junction thermocouple fabricated in the above manner is improved in liquid sodium from typically 120 msec for a 1.6 mm OD sheathed, conventional, grounded-junction thermocouple to 10 msec for a thermocouple of the present invention of the same size. A similar improvement (100 msec to 20 msec) was noted in a boiling water system. One side-welded sheathed thermocouple of the present invention survived 1800 thermal shocks in sodium from 150° to 650° C., and the failure was not at the junction; whereas four conventional grounded-junction thermocouples survived an average of 1350 thermal shocks. Two of the present thermocouples survived 25 thermal shocks from a furnace at 550° F. into cold water without failure. The time response of one prototype was independent of temperature up to 660° C. in contrast to a temperature dependence for other prior thermocouples. Thus, the time response may be determined at any convenient temperature with the assurance that the response will be the same at other temperatures.

This invention has been described by way of illustration rather than by limitation and it should be apparent that it is equally applicable in fields other than those described.

What is claimed is:

1. A method of fabricating the measuring junction of a grounded-junction sheathed thermocouple to obtain fast time response and good thermal cycling performance comprising the steps of removing the insulation from the end of said thermocouple at the region of the measuring junction of said thermocouple, providing a pair of closely spaced slots in the sheath of said thermocouple at the edge thereof, bending the respective ends of the thermocouple wires 90°, inserting the respective tips of said wires into said respective slots, placing a thin metal disc over the end of said sheath, and finally laser-welding said wire tips and said metal disc to said sheath, whereby the time response and the thermal cycling performance of the completed thermocouple are substantially improved in a subsequent use thereof, compared with a conventional thermocouple.

* * * * *